United States Patent [19]

Khoury et al.

[11] Patent Number: 5,532,637

[45] Date of Patent: Jul. 2, 1996

[54] LINEAR LOW-NOISE MIXER

[75] Inventors: George Khoury; Ronald D. Beards, both of Ottawa; John J. Nisbet, Nepean, all of Canada

[73] Assignee: Northern Telecom Limited, Montreal, Canada

[21] Appl. No.: 496,648

[22] Filed: Jun. 29, 1995

[51] Int. Cl.[6] .................................................. H03B 19/00
[52] U.S. Cl. ..................... 327/359; 327/355; 327/356; 327/113; 327/119; 327/105; 455/333
[58] Field of Search .................................. 327/113, 116, 327/119, 355, 356, 357, 359, 105; 455/333, 330, 326

[56] References Cited

U.S. PATENT DOCUMENTS

| 4,937,516 | 6/1990 | Sempel | 327/105 |
| 5,182,477 | 1/1993 | Yamasaki et al. | 327/65 |

OTHER PUBLICATIONS

"Applications of Monolithic Analog Multiplier" by A. Bilotti, IEEE Journal of Solid–State Circuits, Dec. 1968, pp. 373–380.

"The LS6440 High Performance Integrated Circuit Mixer" by P. E. Chadwick, Plessey Semiconductors Limited, Swindon, England, 1981, pp. 1–9.

*Primary Examiner*—Timothy P. Callahan
*Assistant Examiner*—Dinh T. Le
*Attorney, Agent, or Firm*—R. John Haley

[57] ABSTRACT

A tree mixer includes a first differential pair of transistors which divide current from a first current source between the transistors in dependence upon a first differential input signal supplied to first input terminals. Two second differential pairs of transistors have controlled paths which conduct current, divided between the transistors of the differential pair in dependence upon a second differential input signal supplied to second input terminals, dependent upon current passed by a respective transistor of the first pair of transistors, to produce a product signal at output terminals. One or more second current sources provide for the total current passed by the first pair of transistors to be greater than the total current passed by the two second pairs of transistors, for improved linearity without increasing noise. A quadrature phase modulator can include two such mixers with common output circuitry.

17 Claims, 3 Drawing Sheets

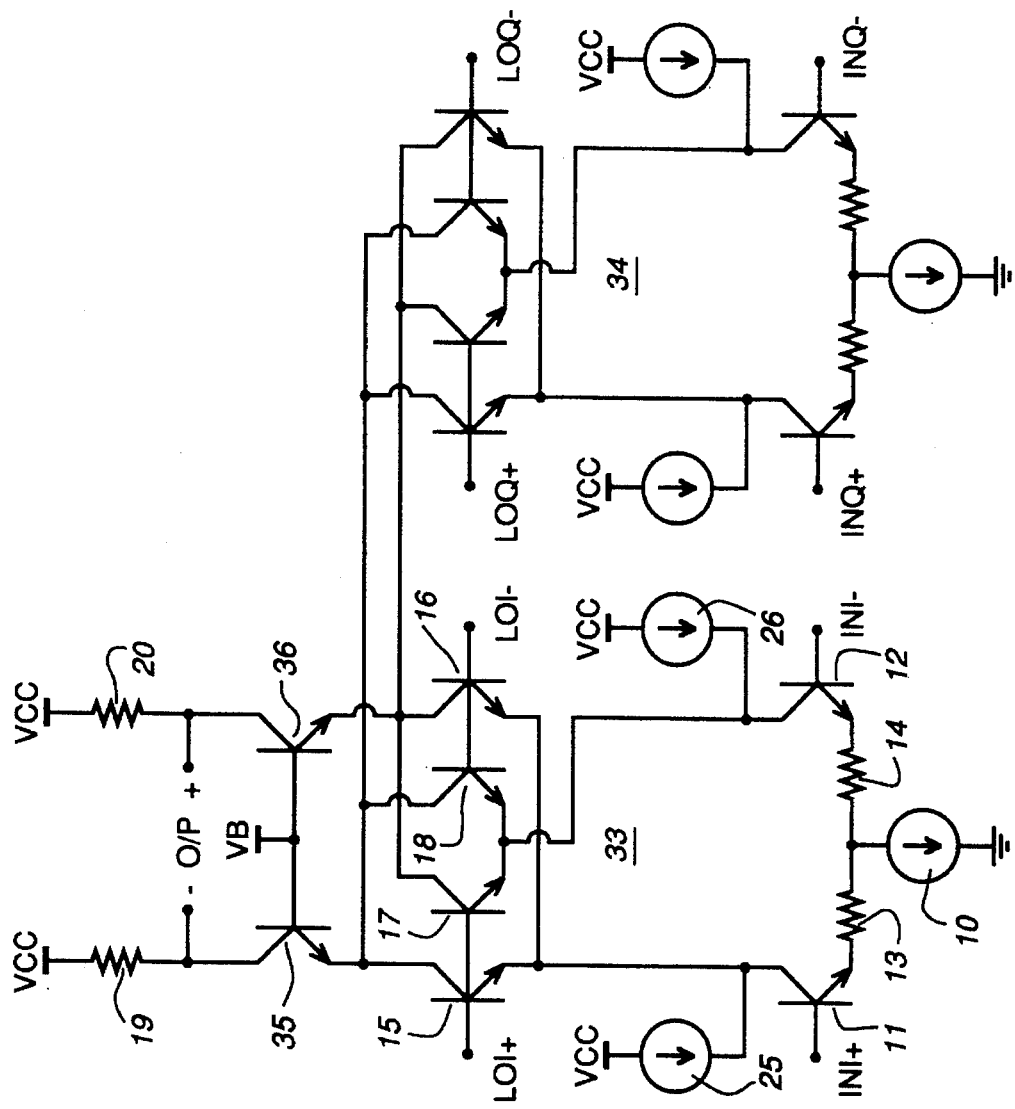
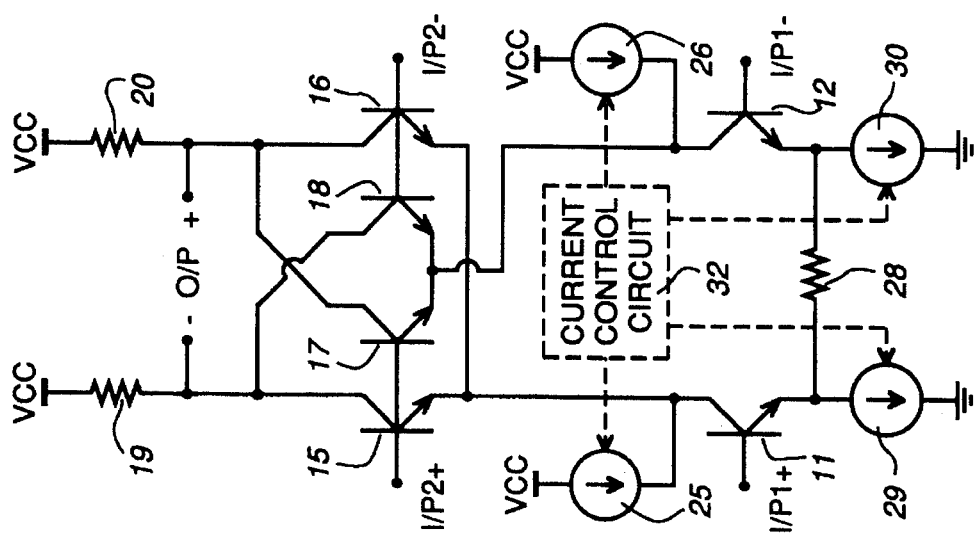
Fig. 4
Fig. 3

LINEAR LOW-NOISE MIXER

This invention relates to mixers, and is particularly concerned with a tree mixer which can provide linear and low-noise operation. Such mixers are especially useful in radio communications systems.

BACKGROUND OF THE INVENTION

Tree mixers, also known as analog multipliers or Gilbert multipliers, have been widely used in integrated circuits for communications systems for many years. As is known for example from A. Bilotti, "Applications Of A Monolithic Analog Multiplier", IEEE Journal of Solid-State Circuits, December 1968, pages 373 to 380, such a mixer or multiplier typically comprises a first or lower differential pair of common emitter transistors to the bases of which a first differential analog input signal is supplied, and two second or upper differential pairs of transistors whose bases are supplied with a second differential analog input signal and whose collector-emitter paths conduct the currents of the lower pair of transistors to produce in their collector circuits an analog output signal which represents the product of the input signals. A single current source in the emitter circuit of the lower pair of transistors provides bias current to all six transistors. For use as a mixer in a radio communications receiver or transmitter, for example an input signal is applied to the lower pair of transistors and a local oscillator signal is applied to the two upper pairs, or upper quad, of transistors.

Such a circuit provides advantages of good rejection of the input signals at the output, good power supply rejection, and the possibility of conversion gain. It has a disadvantage in that them is a trade-off between noise and distortion, which limits the achievable dynamic range. Noise can be reduced, but distortion is increased, by decreasing the bias current and resistance in the emitter circuit of the lower pair of transistors. Conversely distortion can be reduced (linearity increased) by increasing these parameters, but this increases noise, especially shot noise from the upper quad of transistors, this being proportional to the bias current.

In an attempt to improve this trade-off, P. E. Chadwick, "The SL6440 High Performance Integrated Circuit Mixer", Plessey Semiconductors Limited, 1981, discloses that complementary linearising transistors can be added to the lower pair of transistors to provide negative feedback. However, this approach has the disadvantages of introducing noise and presenting bias stability problems for practical ranges of operating temperature and integrated circuit process parameters.

In Yamasaki et al. U.S. Pat. No. 5,182,477, issued Jan. 26, 1993 and entitled "Bipolar Tunable Transconductance Element", there is described a transconductance element which can be used as a biquad filter and in which another degree of freedom is added to the determination of pole frequency and pole quality factor by incorporating additional current sources. Although this patent refers to a Gilbert multiplier, the circuit described is in fact a Gilbert gain cell with only one input for an a.c. signal, and an input for a d.c. control voltage. The circuit of this patent is not a mixer producing an output which represents the product of two input signals, and provides no frequency conversion as in a tree mixer. Although this patent also refers to implementing dual-input or multiple input transconductance elements, this is clearly seen from the patent to refer to a sum, not a product, of the input signals. Thus the operation of the circuit of this patent is completely different from the operation of a tree mixer.

An object of this invention is to provide a tree mixer in which the disadvantages discussed above are reduced.

SUMMARY OF THE INVENTION

According to one aspect of this invention there is provided a tree mixer comprising: a first differential pair of transistors having a current source in their emitter circuit and terminals for supplying a first differential input signal to their bases; two second differential pairs of transistors having terminals for supplying a second differential input signal to their bases, emitters coupled to collectors of the first pair of transistors, and collector circuits providing an output signal representing a product of the input signals; and at least one further current source coupled to the collectors of the first pair of transistors, so that total current passed by the first pair of transistors is greater than total current passed by the two second pairs of transistors.

According to another aspect, the invention provides a mixer comprising: first input terminals for a first differential input signal; a first current source; a first differential pair of transistors arranged to divide current from the first current source between the transistors of the differential pair in dependence upon a first differential input signal supplied to the first input terminals; second input terminals for a second differential input signal; two output terminals; two second differential pairs of transistors, each second differential pair of transistors having controlled paths coupled to the output terminals and arranged to conduct a current, divided between the transistors of the differential pair in dependence upon a second differential input signal supplied to the second input terminals, dependent upon current passed by a respective transistor of the first differential pair of transistors; and at least one second current source coupled to two junctions each between a respective pair of the two second pairs of differential transistors and said respective transistor of the first differential pair of transistors, so that total current passed by the first differential pair of transistors is greater than total current passed by the two second differential pairs of transistors.

The current supplied from the at least one second current source enables the first differential pair of transistors to be operated at a relatively higher current, for reduced distortion (improved linearity), and the two second differential pairs of transistors to be operated at a relatively lower current, at which noise is reduced.

According to a further aspect, the invention provides a mixer comprising: at least one first current source; at least one second current source; a first differential pair of transistors having controlled paths coupled between the first and second current sources and arranged to divide current passed by the first current source between said controlled paths in dependence upon a first differential input signal; two second differential pairs of transistors, each second differential pair of transistors having controlled paths coupled to a junction between a respective transistor of the first differential pair of transistors and the at least one second current source and being arranged to conduct current divided between the transistors of the differential pair in dependence upon a second differential input signal; and output terminals coupled to the controlled paths of the two second differential pairs of transistors for producing an output signal comprising a product of the first and second differential input signals.

The invention also extends to a modulator comprising two mixers each as recited above for mixing signals in phase quadrature, the output terminals being common to the two mixers to provide an output signal representing a sum of the phase quadrature products of input signals to the two mixers.

BRIEF DESCRIPTION OF THE DRAWINGS

The invention will be further understood from the following description with reference to the accompanying drawings, in which:

FIG. 3 schematically illustrates a circuit diagram of a tree mixer in accordance with another embodiment of this invention; and FIG. 4 schematically illustrates a circuit diagram of a modulator including two tree mixers in accordance with a further embodiment of this invention.

DETAILED DESCRIPTION

Figure 1:
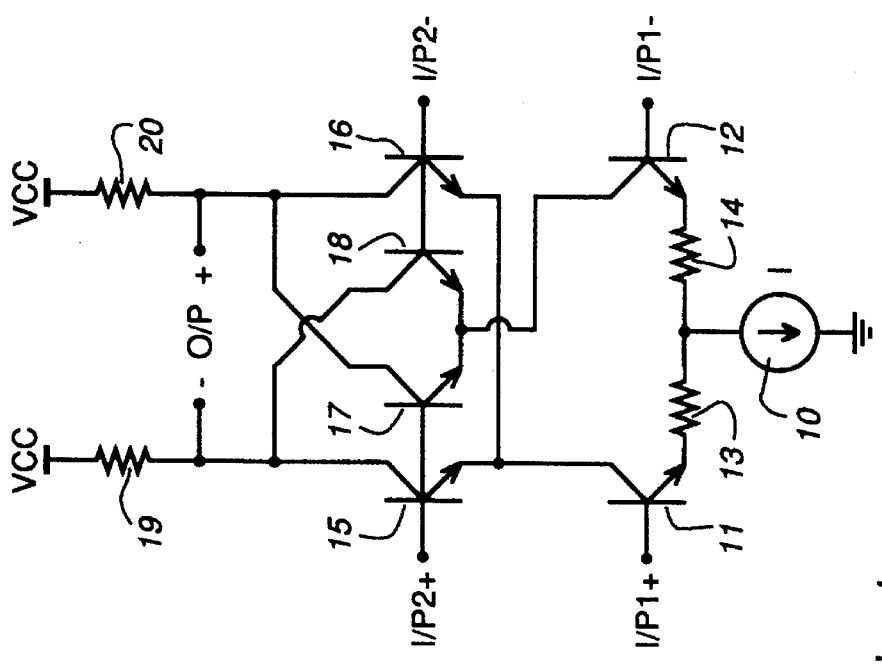
FIG. 1 schematically illustrates a circuit diagram of a known tree mixer.

Referring to FIG. 1, a known tree mixer includes a differential pair of transistors 11 and 12 whose emitters are connected to a constant current source 10 via respective emitter resistors 13 and 14. A first differential analog input signal is supplied to the bases of the transistors 11 and 12 via input terminals I/P1+ and I/P1– respectively. Two differential pairs of transistors 15, 16 and 17, 18 are connected in the collector circuits of the transistors 11 and 12 respectively. A second differential analog input signal is supplied to the bases of the transistors 15 and 16 via input terminals I/P2+ and I/P2– respectively. The transistors 15 and 16 have their emitters connected together and to the collector of the transistor 11, and have their collectors connected to differential output terminals O/P– and + respectively and via respective resistors 19 and 20 to a positive supply voltage VCC. The second differential analog input signal is also supplied via the input terminals I/P2+ and I/P2– to the bases of the transistors 17 and 18 respectively, whose emitters are connected together and to the collector of the transistor 12, and whose collectors are cross-connected to the differential output terminals O/P+ and – respectively.

In operation of the tree mixer of FIG. 1, the current I passed by the current source 10 is divided between the transistors 11 and 12 according to the first input signal, the degeneration resistors 13 and 14 increasing a maximum useful input voltage for the mixer and setting an effective transconductance for this input circuit of about $1/(2 Re)$ where Re is the resistance of each of the resistors 13 and 14. Transistors 15 to 18 multiply the currents of the transistors 11 and 12 alternately by +1 and –1 at the frequency of the second signal supplied differentially to the inputs I/P2+ and I/P2–. In a radio communications mixer, the second signal is typically a local oscillator signal. The collector currents of the transistors 15 to 18 are converted to a differential output voltage by the collector resistors 19 and 20, with a single sideband conversion gain of $(2/\pi)(Rc/Re)$ where Rc is the resistance of each of the resistors 19 and 20.

As discussed in the introduction, the tree mixer of FIG. 1 has the disadvantage of a trade-off between noise and distortion: decreasing the current I and the resistance Re reduces noise but increases distortion, and conversely increasing the current I and the resistance Re reduces distortion but increases noise.

Figure 2:
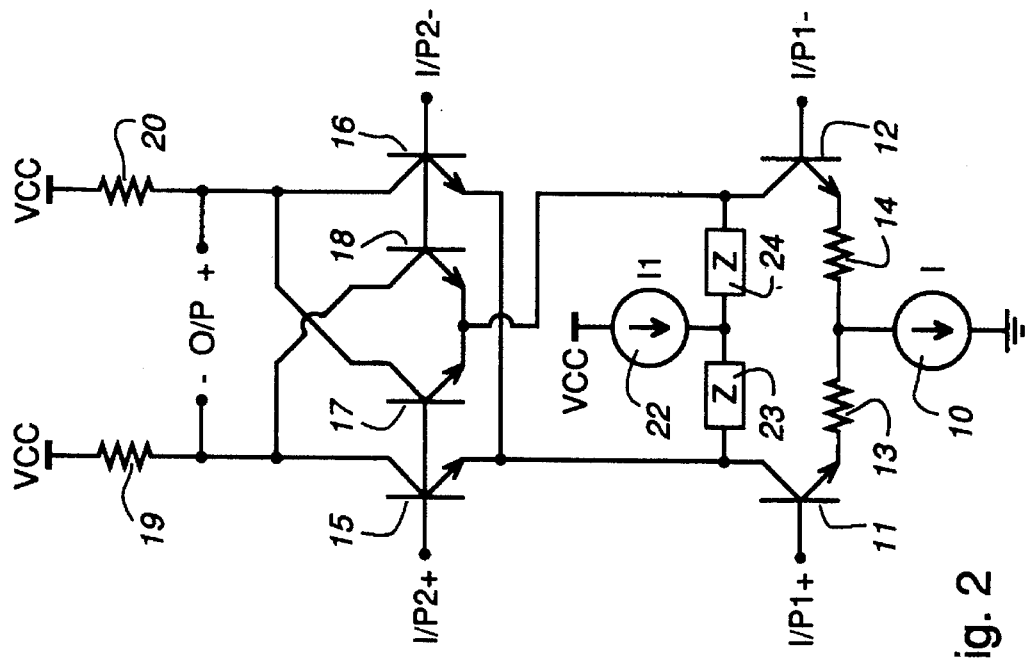
FIG. 2 schematically illustrates a circuit diagram of a tree mixer in accordance with an embodiment of this invention.

This disadvantage is substantially reduced in a tree mixer in accordance with the invention, an embodiment of which is illustrated in FIG. 2. The tree mixer of FIG. 2 is the same as that of FIG. 1 except in that it also includes a second current source 22 for supplying a constant current I1 from the positive supply voltage VCC to the collectors of the two transistors 11 and 12 via impedances Z referenced 23 and 24 respectively. The impedances 23 and 24 comprise equal resistances and/or inductances providing isolation between the collectors of the transistors 11 and 12.

In the tree mixer of FIG. 2, the current I1 is less than the current I. Consequently, the transistors 11 and 12 conduct a total current of I which is greater than the total current I–I1 which is conducted by the transistors 15 to 18. Thus the current I can be relatively high so that the transistors 11 and 12 operate with relatively low distortion, and the current I–I1 can be relatively low so that the transistors 15 to 18 operate with relatively low noise. This reduced current I–I1 through the resistors 19 and 20 also reduces headroom constraints in relation to the supply voltage VCC due to the reduced voltage drop across these resistors.

By way of example, the current I can be about 30 mA, and the current I1 can be about 24 mA, so that the total current passed by the transistors 15 to 18 is only 6 mA, much less than the total current passed by the transistors 11 and 12.

FIG. 3 illustrates an alternative embodiment of the invention, in which the need for the impedances 23 and 24 is avoided by providing two current sources 25 and 26, connected between the supply voltage VCC and the collectors of the transistors 11 and 12 respectively, instead of the single current source 22 in the mixer of FIG. 2. In addition, the tree mixer of FIG. 3 is modified from that of FIG. 2 in that the emitter resistors 13 and 14 and common current source 10 are replaced by a common emitter resistor 28 and two separate current sources 29 and 30, connected between the emitters of the transistors 11 and 12 respectively and ground. Each of the current sources 29 and 30 can conduct a current I/2, and each of the current sources 25 and 26 can conduct a current I1/2, so that the mixer of FIG. 3 operates in the same manner and with the same currents as the mixer of FIG. 2. Alternatively, as illustrated in FIG. 3 by dashed lines, the current sources 25, 26, 29, and 30 can be variable current sources which pass currents determined by a current control circuit 32, whereby the individual currents can be optimized for particular circumstances.

FIG. 4 illustrates a quadrature modulator which includes two tree mixers 33 and 34 in accordance with a further embodiment of the invention. The first tree mixer 33 includes components 10 to 20 as described above with reference to FIG. 1, together with the two current sources 25 and 26 in accordance with this invention as described above with reference to FIG. 3, and two additional transistors 35 and 36 operating in a cascode configuration in the output circuit of the mixer. The transistors 35 and 36 operate in a common base mode with their bases connected to a supply voltage VB, their emitters connected to the collectors of the transistors 15, 18 and 16, 17 respectively, and their collectors connected to the output terminals O/P– and + respectively and correspondingly to the resistors 19 and 20 respectively. This cascode configuration is especially useful when the output frequency is substantially higher than the input frequency. The first input signal to the first tree mixer 33 is a differential input signal INI+ and INI–, and the second input signal to the first tree mixer 33 is a differential local oscillator signal LOI+ and LOI–.

The second tree mixer 34 in the modulator of FIG. 4 is similar to the first tree mixer 33, except that it shares the same output circuitry comprising the resistors 19 and 20 and the cascode transistors 35 and 36. Thus the collectors of the upper two pairs of transistors in the mixer 34 are also connected to the emitters of the transistors 35 and 36, so that outputs of the two tree mixers 33 and 34 are summed at the output of the modulator. The first input signal to the second tree mixer 34 is a quadrature phase differential input signal INQ+ and INQ–, and the second input signal to the second tree mixer 34 is a quadrature phase differential local oscillator signal LOQ+ and LOQ–. Thus the modulator of FIG. 4 provides for mixing and summing of quadrature phase input and local oscillator signals.

Figure 5:
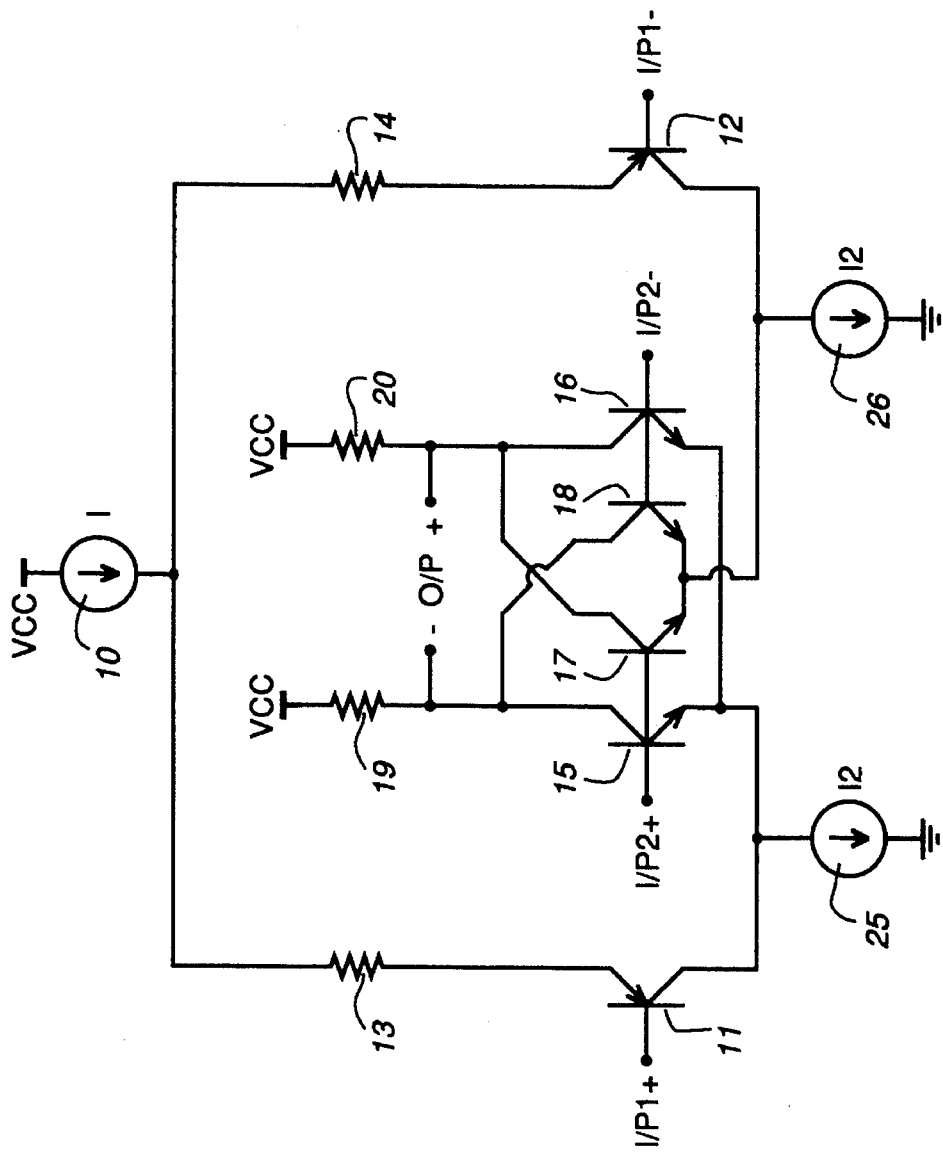
FIG. 5 schematically illustrates a circuit diagram of a tree mixer in accordance with a further embodiment of this invention.

FIG. 5 illustrates a tree mixer in accordance with a further embodiment of the invention, in which the transistors 11 and 12 are of complementary type to the transistors 15 to 18. As illustrated, the transistors 11 and 12 are PNP transistors and the transistors 15 to 18 are NPN transistors, but these could be interchanged with a reversal of supply voltage polarity. In this tree mixer, the current source 10 is coupled between the supply voltage VCC and the emitters of the transistors 11 and 12 via the resistors 13 and 14 respectively. The current source 25 is connected between ground and the interconnected collector of the transistor 11 and emitters of the transistors 15 and 16, and the current source 26 is connected between ground and the interconnected collector of the transistor 12 and emitters of the transistors 17 and 18. The current source 10 passes the current I, and each of the current sources 25 and 26 passes a current I2 which is chosen to be less than I and more than I/2, so that the total current I passed by the transistors 11 and 12 is greater than the total current 2I2–I passed by the transistors 15 to 18. The tree mixer of FIG. 5 is particularly useful for operation with a relatively low supply voltage VCC, for example in a battery-powered transceiver.

Although particular embodiments of the invention have been described in detail, it should be appreciated that numerous modifications, variations, and adaptations may be made without departing from the scope of the invention as defined in the claims. For example, it can be appreciated that each of the current sources can be constituted by either a semiconductor circuit providing a controlled current, or simply by a resistor having a suitable value for providing a desired current. In addition, although the embodiments of the invention described above all provide a differential output, an unbalanced output can alternatively be provided as illustrated by FIG. 2 of the Bilotti reference. Furthermore, although the embodiments of the invention described above all use bipolar transistors, field effect transistors could alternatively be used.

What is claimed is:

1. A tree mixer comprising:
    a first differential pair of bipolar transistors having a current source coupled to their emitters and first input terminals coupled to their bases for supplying a first differential input signal thereto;
    two second differential pairs of bipolar transistors having second input terminals coupled to their bases for supplying a second differential input signal to each pair of the two second differential pairs of transistors, the transistors of each pair of the two second differential pairs of transistors having emitters coupled to the collector of a respective transistor of the first differential pair of transistors, and the transistors of the two second differential pairs of transistors having collectors for providing an output signal representing a product of the input signals; and
    at least one further current source coupled to the collectors of the first differential pair of transistors for conducting current so that total collector-emitter current passed by the first differential pair of transistors is greater than total collector-emitter current passed by the two second differential pairs of transistors.

2. A mixer as claimed in claim 1 and further including two impedances each coupling the at least one further current source to the collector of a respective transistor of the first differential pair of transistors.

3. A mixer as claimed in claim 1 wherein the at least one further current source comprises two current sources each coupled to the collector of a respective transistor of the first differential pair of transistors.

4. A mixer as claimed in claim 3 wherein the transistors of the first differential pair of transistors are of complementary bipolar type to the transistors of the two second differential pairs of transistors.

5. A mixer as claimed in claim 1 and further including a current control circuit coupled to said at least one further current source.

6. A mixer as claimed in claim 1 and further including two further transistors connected in a cascode arrangement to the collectors of the two second differential pairs of transistors.

7. A mixer as claimed in claim 1 wherein the collectors of the two second differential pairs of transistors are connected to provide a differential output.

8. A mixer comprising:
    first input terminals for a first differential input signal;
    a first current source;
    a first differential pair of transistors coupled to said first input terminals and to said first current statue for dividing current from the first current source between the transistors of the first differential pair in dependence upon said first differential input signal;
    second input terminals for a second differential input signal;
    two output terminals;
    two second differential pairs of transistors coupled to said second input terminals, each of the second differential pairs of transistors having controlled current paths coupled to the output terminals and connected to conduct a current, divided between the transistors of the respective pair of the two second differential pairs in dependence upon said second differential input signal, dependent upon current passed by a respective transistor of the first differential pair of transistors; and
    at least one second current source coupled to two junctions each between a respective pair of the two second differential pairs of transistors and said respective transistor of the first differential pair of transistors, for passing current so that total current passed by controlled current paths of the first differential pair of transistors is greater than total current passed by the controlled current paths of the two second differential pairs of transistors.

9. A mixer as claimed in claim 8 wherein the at least one second current source is coupled to each of said two junctions via a respective one of two impedances.

10. A mixer as claimed in claim 8 wherein said at least one second current source comprises two second current sources each coupled to a respective one of said two junctions.

11. A mixer as claimed in claim 8 and further including a current control circuit coupled to said at least one second current source.

12. A mixer as claimed in claim 8 and further including two further transistors connected in a cascode arrangement with the two second differential pairs of transistors.

13. A mixer as claimed in claim 8 wherein the two output terminals am connected to provide a differential output.

14. A mixer comprising:

at least one first current source;

at least one second current source;

a first differential pair of transistors having controlled current paths coupled between the at least one first current source and the at least one second current source and connected to divide current passed by the at least one first current source between said controlled current paths in dependence upon a first differential input signal supplied to the first differential pair of transistors;

two second differential pairs of transistors, each pair of the two second differential pairs of transistors having controlled current paths coupled to a respective junction between a respective transistor of the first differential pair of transistors and the at least one second current source and being connected to conduct current divided between the transistors of the respective pair of the two second differential pairs of transistors in dependence upon a second differential input signal supplied to the two second differential pairs of transistors, total current passed by the controlled current paths of the two second differential pairs of transistors being less than total current passed by the controlled current paths of the first differential pair of transistors; and output terminals coupled to the controlled current paths of the two second differential pairs of transistors for providing an output signal comprising a product of the first and second differential input signals.

15. A mixer as claimed in claim 14 wherein the transistors of the first differential pair of transistors are of complementary bipolar type to the transistors of the two second differential pairs of transistors.

16. A mixer as claimed in claim 15 wherein said at least one second current source comprises two second current sources each coupled to one of the respective junctions.

17. A mixer as claimed in claim 14 wherein said at least one second current source comprises two second current sources each coupled to one of the respective junctions.

* * * * *